(12) United States Patent
Pagaila et al.

(10) Patent No.: US 8,258,010 B2
(45) Date of Patent: Sep. 4, 2012

(54) MAKING A SEMICONDUCTOR DEVICE HAVING CONDUCTIVE THROUGH ORGANIC VIAS

(75) Inventors: Reza A. Pagaila, Singapore (SG); Byung Tai Do, Singapore (SG); Shuangwu Huang, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 430 days.

(21) Appl. No.: 12/406,038

(22) Filed: Mar. 17, 2009

(65) Prior Publication Data

US 2010/0237471 A1    Sep. 23, 2010

(51) Int. Cl.
*H01L 21/50* (2006.01)
(52) U.S. Cl. ........ 438/113; 438/106; 438/114; 438/455; 438/458; 438/460; 438/464; 438/638; 257/E21.476
(58) Field of Classification Search .......... 438/106–109, 438/113–114, 455, 458, 460, 464, 638
See application file for complete search history.

(56) References Cited

U.S. PATENT DOCUMENTS

| 7,033,917 | B2 | 4/2006 | Ho et al. | |
|---|---|---|---|---|
| 7,378,342 | B2 | 5/2008 | Kirby et al. | |
| 2004/0127002 | A1* | 7/2004 | Kim | 438/586 |
| 2005/0212126 | A1* | 9/2005 | Sunohara | 257/730 |
| 2007/0108591 | A1* | 5/2007 | Sunohara et al. | 257/700 |
| 2008/0057674 | A1 | 3/2008 | Hwang | |
| 2009/0039523 | A1* | 2/2009 | Jiang et al. | 257/777 |
| 2009/0317944 | A1* | 12/2009 | Kim | 438/107 |

* cited by examiner

*Primary Examiner* — Thanh Nguyen
(74) *Attorney, Agent, or Firm* — Robert D. Atkins; Patent Law Group: Atkins & Associates, P.C.

(57) ABSTRACT

A plurality of semiconductor die is mounted to a carrier separated by a peripheral region. An insulating material is deposited in the peripheral region. A first opening is formed in the insulating material of the peripheral region to a first depth. A second opening is formed in the insulating material of the peripheral region centered over the first opening to a second depth less than the first depth. The first and second openings constitute a composite through organic via (TOV) having a first width in a vertical region of the first opening and a second width in a vertical region of the second opening. The second width is different than the first width. A conductive material is deposited in the composite TOV to form a conductive TOV. An organic solderability preservative (OSP) coating is formed over a contact surface of the conductive TOV.

29 Claims, 7 Drawing Sheets

MAKING A SEMICONDUCTOR DEVICE HAVING CONDUCTIVE THROUGH ORGANIC VIAS

FIELD OF THE INVENTION

The present invention relates in general to semiconductor devices and, more particularly, to a semiconductor die and method of forming through organic vias having varying width in a peripheral region of the die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

The vertical electrical interconnection between stacked semiconductor packages can be accomplished with conductive through silicon vias (TSV) or through hole vias (THV). The THVs are typically made with copper and formed in organic materials in a peripheral region around the device. When interconnecting stacked semiconductor die, the small size of the THV makes it difficult to properly align the THV with its mating surface. Improper alignment can cause device defects. Manufacturers often use high-precision bonding equipment to achieve adequate yield, but such equipment adds significant manufacturing cost to the product. In addition, the copper-filled THV can oxidize which reduces adhesion strength and increases contact resistance between bonded vias, particularly in the presence of high temperature and high pressure during die stacking.

SUMMARY OF THE INVENTION

A need exists to electrically interconnect semiconductor die in the vertical direction. Accordingly, in one embodiment, the present invention is a method of making a semiconductor device comprising the steps of providing a temporary carrier, mounting a plurality of semiconductor die over the temporary carrier separated by a peripheral region, depositing an insulating material in the peripheral region, removing the temporary carrier, removing a first portion of the insulating material of the peripheral region to form a first opening having a first depth, and removing a second portion of the insulating material of the peripheral region over the first opening to form a second opening to a second depth less than the first depth. The first and second openings constitute a composite through organic via (TOV) having a first width in a vertical region of the first opening and a second width in a vertical region of the second opening. The second width is different from the first width. The method further includes the steps of depositing a conductive material in the composite TOV to form a conductive TOV, forming a conductive layer between the conductive TOV and a contact pad of the semiconductor die, and singulating the semiconductor wafer through the peripheral region to separate the semiconductor die.

In another embodiment, the present invention is a method of making a semiconductor device comprising the steps of providing a plurality of semiconductor die separated by a peripheral region, depositing an insulating material in the peripheral region, forming a first opening in the insulating material of the peripheral region to a first depth, and forming a second opening in the insulating material of the peripheral region over the first opening to a second depth less than the first depth, the first and second openings constitute a composite TOV having a first width in a vertical region of the first opening and a second width in a vertical region of the second opening. The second width is different from the first width. The method further includes the steps of depositing a conductive material in the composite TOV to form a conductive TOV, and forming a first conductive layer between the conductive TOV and a contact pad of the semiconductor die.

In another embodiment, the present invention is a method of making a semiconductor device comprising the steps of providing a plurality of semiconductor die separated by an insulating material in a peripheral region, forming a first opening in the insulating material of the peripheral region to a first depth, and forming a second opening in the insulating material of the peripheral region over the first opening to a second depth less than the first depth. The first and second openings constitute a composite TOV having a varying width. The method further includes the step of depositing a conductive material in the composite TOV to form a conductive TOV.

In another embodiment, the present invention is a semiconductor device comprising a semiconductor die having a peripheral region containing insulating material. A conductive TOV is formed vertically in a peripheral region of the semiconductor die. The conductive TOV has a first width in a first vertical region and a second width in a second vertical region. The first width is different from the first width. A first conductive layer is formed between the conductive TOV and a contact pad of the semiconductor die.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the semiconductor material conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along nonfunctional regions of the wafer called saw streets or scribes.

The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
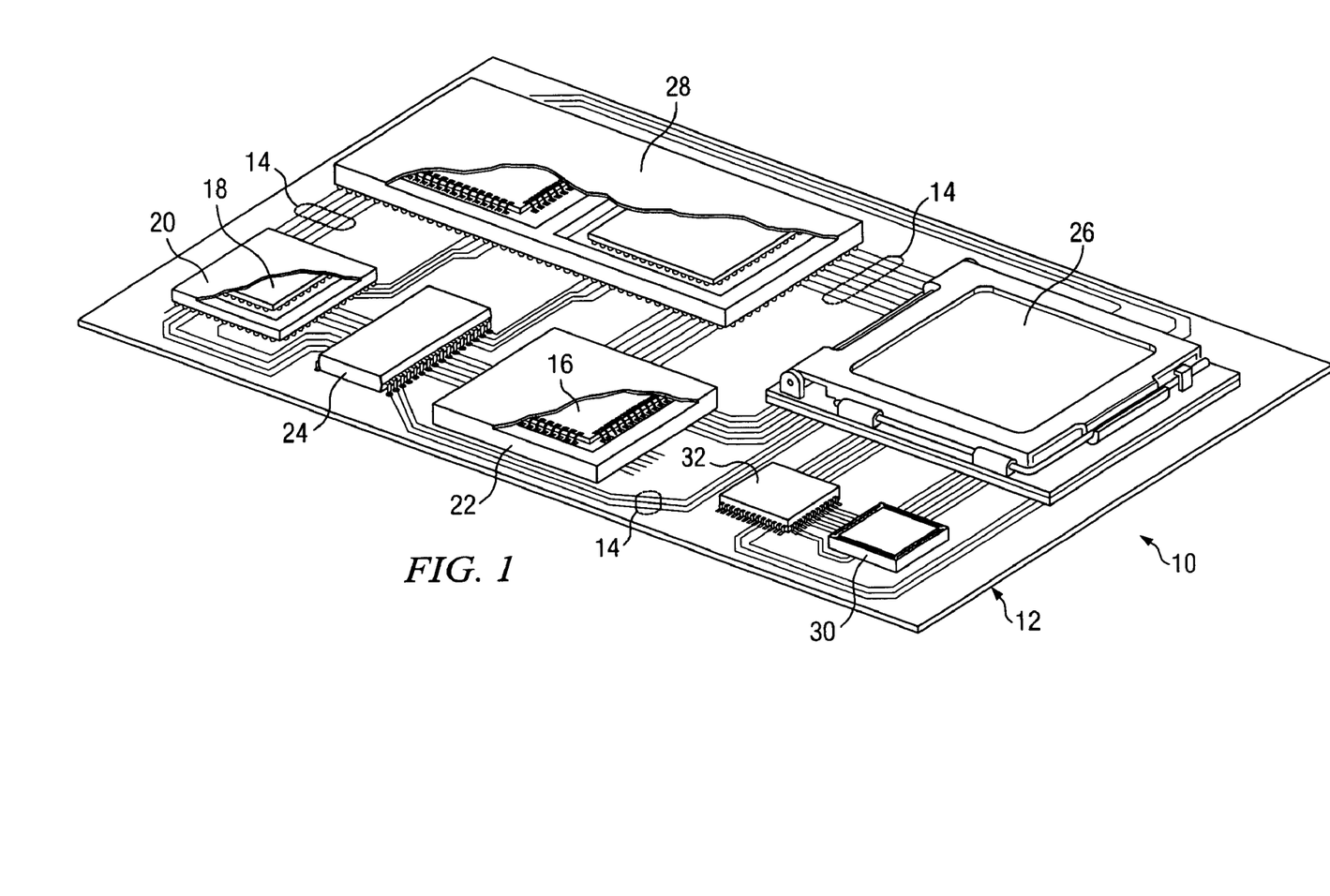
FIG. 1 illustrates a printed circuit board (PCB) with different types of packages mounted to its surface.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed over a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in lower costs for consumers.

Figure 2A:
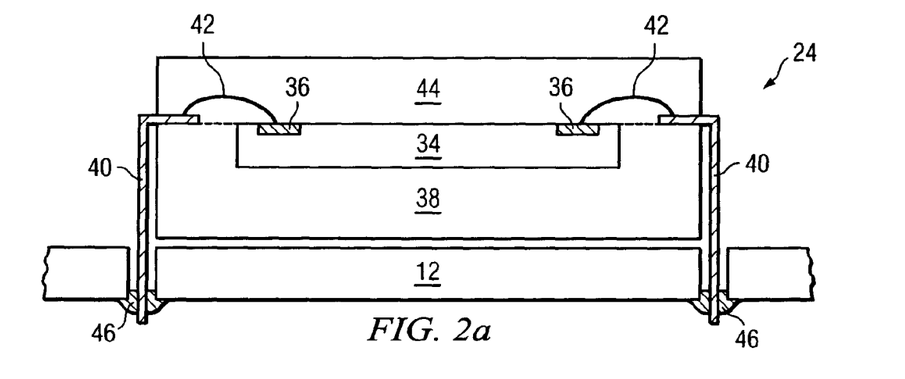
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
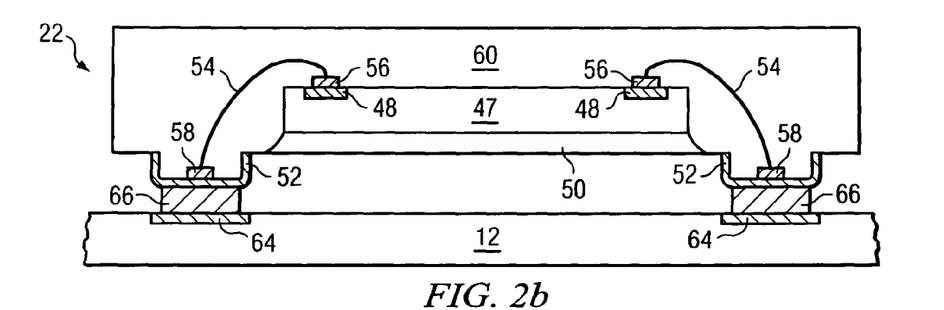

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed over a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
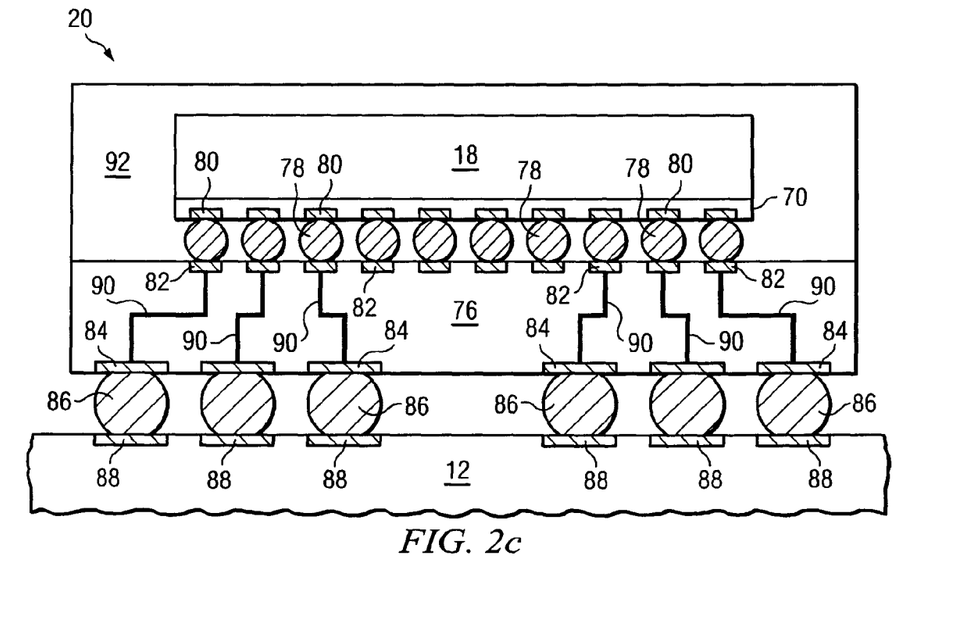

In FIG. 2c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed over bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed over bump pads or interconnect sites 84. The bump pads 84 are electrically connected to interconnect sites 82 through conductive lines 90 routed through carrier 76. Contact pads 88 are formed over a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and improve overall circuit performance. In another embodiment, the semiconductor die 18 can be mechanically and electrically attached directly to PCB 12 using flip chip style first level packaging without carrier 76.

FIGS. 3a-3f illustrate a process of forming conductive vias in a peripheral region around a semiconductor die. To start the process, a plurality of semiconductor die 102 is formed on a semiconductor wafer using conventional integrated circuit processes, as described above. Each semiconductor die 102 includes analog or digital circuits implemented as active and passive devices, conductive layers, and dielectric layers formed on topside active surface 108 and electrically interconnected according to the electrical design of the die. For example, the circuit may include one or more transistors, diodes, and other circuit elements formed within active surface 108 to implement baseband digital circuits, such as digital signal processor (DSP), memory, or other signal processing circuit. The semiconductor die 102 may also contain integrated passive devices (IPD), such as inductors, capacitors, and resistor, for radio frequency (RF) signal processing. Contact pads 106 electrically connect to active and passive devices and signal traces within active area 108 of semiconductor die 102.

Figure 3A:
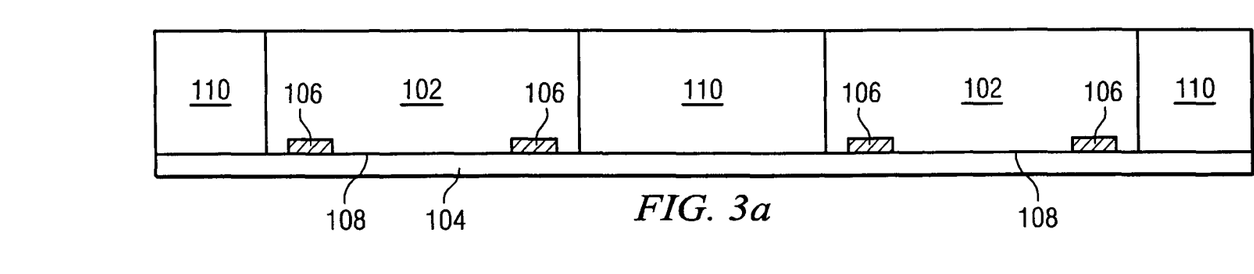
FIGS. 3a-3f illustrate a process of forming through organic vias (TOV) having varying width in a peripheral region of a semiconductor die.

Semiconductor die 102 are singulated from the wafer and transferred to temporary carrier 104 using a pick-and-place operation. Semiconductor die 102 are mounted over carrier 104 using ultraviolet (UV) tape with a predetermined separation or peripheral region to provide adequate spacing between the die to form through organic vias (TOV) or through hole vias (THV), as described below. The front side of semiconductor die 102 is affixed to carrier 104 with contact pads 106 and active surface 108 oriented face down.

In an alternate embodiment, the semiconductor wafer, with semiconductor die 102 separated by a saw street, is mounted to an expansion table with UV tape. A saw blade or laser tool cuts through the saw street down to the expansion table in a dicing operation. The expansion table moves in two-dimension lateral directions to expand the width of the saw street and form a peripheral region which creates a greater physical separation between the die. The expansion table moves substantially the same distance in the x-axis and y-axis within the tolerance of the table control to provide separation around a periphery of each die.

An organic insulating material 110 is deposited in the peripheral region between semiconductor die 102 using spin coating, needle dispensing, or other suitable application process. In one embodiment, organic material 110 can be benzocyclobutene (BCB), polyimide (PI), or acrylic resin. Alternatively, other non-conductive materials such as a polymer molding compound, liquid epoxy molding, compression molding, soft laminating film, or other material having dielectric or electrical insulating properties can be deposited in the peripheral region. The non-conductive materials can also be deposited using a transfer molding or injection molding process.

Figure 3B:
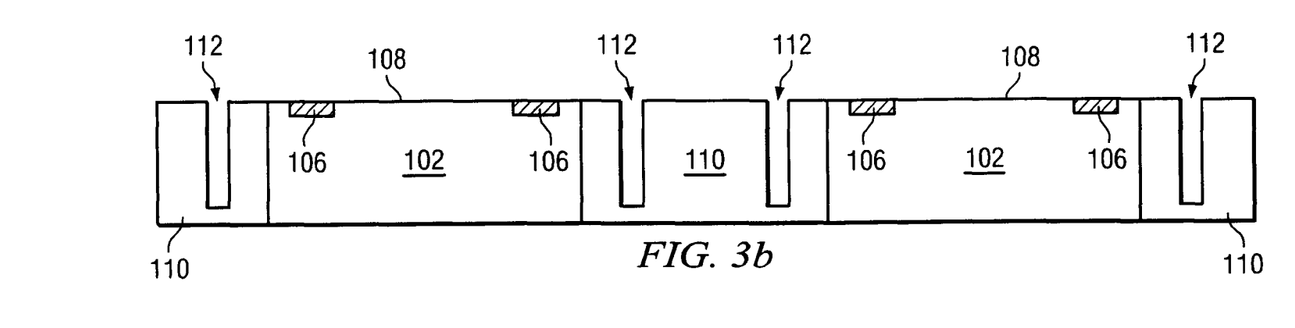
Figure 3C:
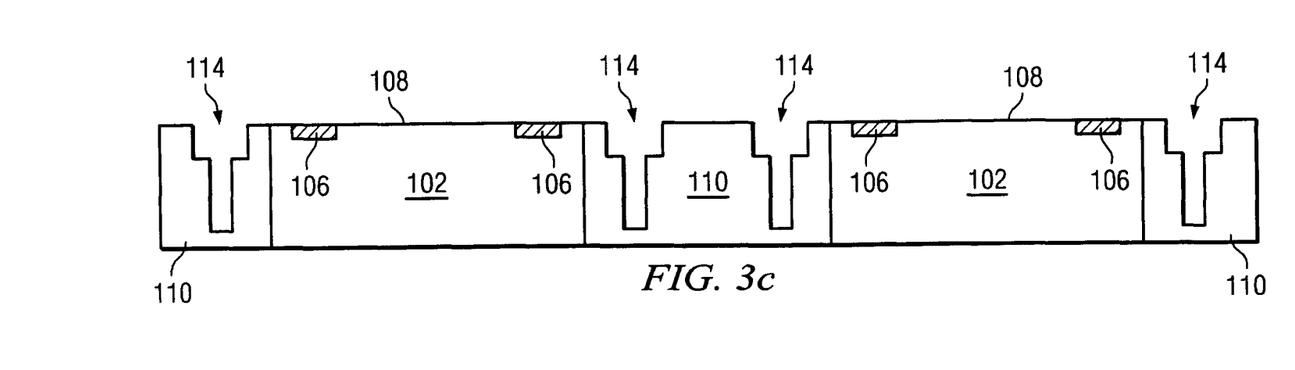

In FIG. 3b, the temporary carrier 104 is removed and the assembly is inverted so that contact pads 106 and active surface 108 face upward. A first portion of organic material 110 is removed by laser drilling or deep reactive ion etching (DRIE) to a depth of 5-500 micrometers (μm) to form an opening or hole 112. In FIG. 3c, a second portion of organic material 110 is removed by laser drilling or DRIE to form an opening or hole 114 to a depth less than the depth of opening 112, e.g. less than half the depth of opening 112. Alternatively, openings 112 and 114 are formed with wet or dry etching using different masks. Opening 114 is centered over opening 112 but cut to a lesser depth. The combination of openings 112 and 114 form a composite T-shaped through organic via having varying widths as the width of opening 114 is greater than the width of opening 112. In one embodiment, the width of opening 112 is 5-400 μm and the width of opening 114 is 2.5-200 μm. The sidewalls of opening 112 and opening 114 can be vertical or tapered.

Figure 3D:
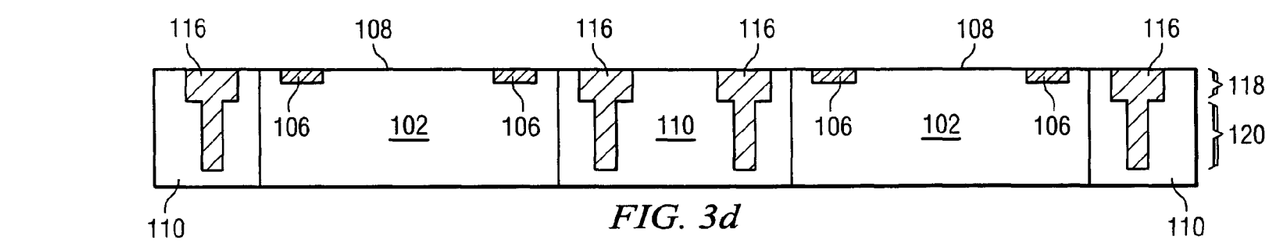

In FIG. 3d, an electrically conductive material 116 is deposited into openings 112 and 114 to form conductive through organic vias (TOV) using PVD, CVD, evaporation, electrolytic plating, electroless plating, screen printing, or other suitable metal deposition process. TOVs 116 have varying widths or diameters, i.e., the TOV has a first width in vertical region 118 of organic material 110 and a second width in vertical region 120 of organic material 110. The first width of TOV 116 in region 118 is greater than the second width of the TOV in region 120. The larger width of TOV 116 in region 118 provides greater alignment tolerance and simplifies interconnection when stacking semiconductor die. The smaller width of TOV 116 in region 118 requires less conductive filling, which decreases manufacturing time. TOVs 116 can have tapered sidewalls which also simplifies the filling of the composite via with conductive material.

Figure 3E:
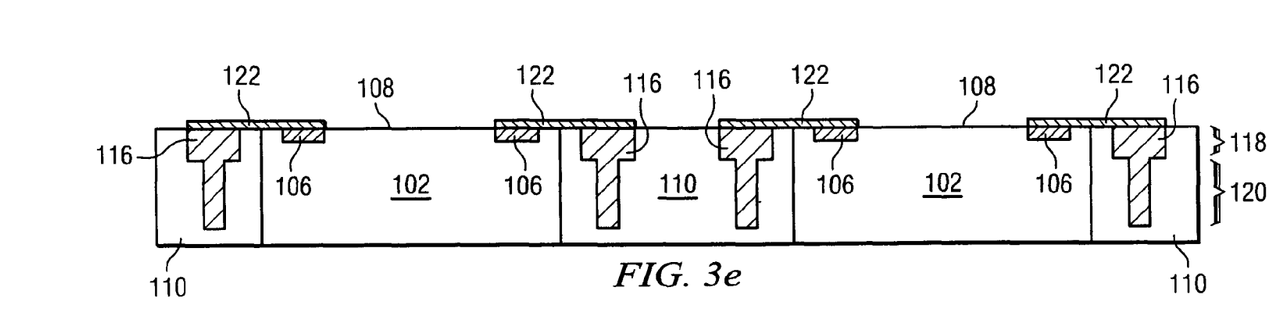

In FIG. 3e, an electrically conductive layer 122 is patterned and deposited over organic material 110 and active surface 108 of semiconductor die 102 using PVD, CVD, evaporation, electrolytic plating, electroless plating, screen printing, or other suitable metal deposition process. An optional passivation layer can be deposited over semiconductor die 102 to isolate conductive layer 122 from active surface 108. The passivation layer can be one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of the passivation layer is removed by an etching process to expose contact pads 106. The conductive layer 122 forms signal traces or redistribution layers (RDL) to electrically connect contact pads 106 to TOVs 116. The conductive material 116 and conductive layer 122 can be one or more layers of Al, Cu, Sn, Ni, Au, Ag, or other suitable electrically conductive material.

Figure 3F:
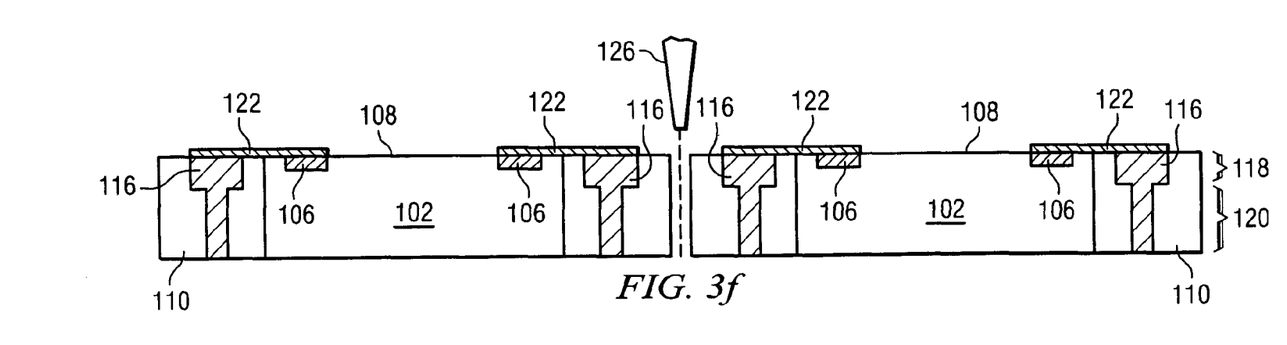

In FIG. 3f, the backside of semiconductor die 102 undergoes a backgrinding process to expose TOV 116. The backgrinding may involve mechanical grinding, CMP, wet etching, dry etching, plasma etching, or another thinning process. Semiconductor die 102 are singulated through a center portion of organic material 110 between TOVs 116. The organic material 110 is cut by a cutting tool 126 such as a saw blade or laser. The cutting tool completely severs the peripheral region to separate the die.

Figure 4:
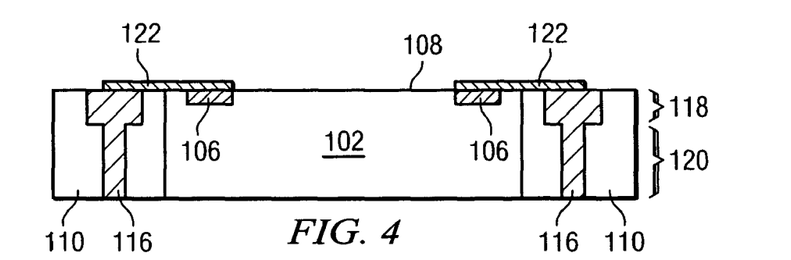
FIG. 4 illustrates the semiconductor die with TOVs having varying width formed in the peripheral region of the die.

FIG. 4 shows a final configuration for semiconductor die 102 with TOVs 116 having varying width, i.e., the topside of TOV 116 larger than the bottom-side of the TOV. Conductive TOVs 116 electrically connect through RDLs 122 to contact pads 106 and electrical components within active surface 108. Conductive TOVs 116 extend from one side of the peripheral region of semiconductor die 102 to the opposite side of the device. Conductive TOVs 116 provide electrically interconnection in the vertical (z) direction when stacking semiconductor die.

Figure 5:
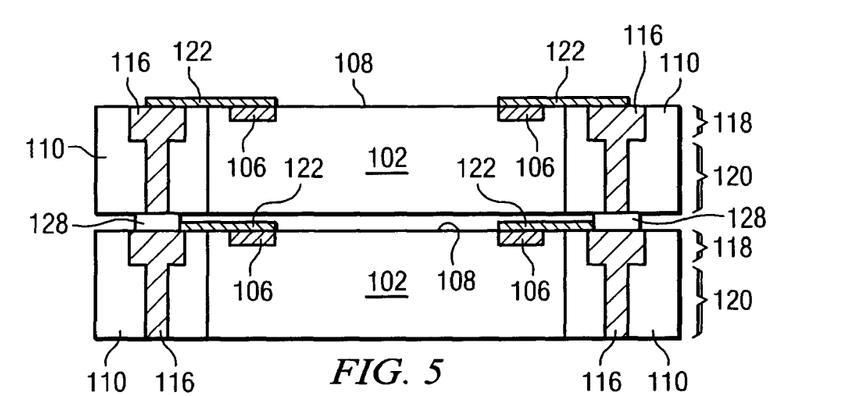
FIG. 5 illustrates two stacked semiconductor die with TOVs having varying width formed in the peripheral region of the die.

FIG. 5 shows two stacked semiconductor die 102. Conductive TOVs 116 are mounted with electrically conductive bonding agent 128. The larger portion of TOV 116 in vertical region 118 increases alignment tolerance with the smaller portion of TOV 116 in vertical region 120. The active surfaces 108 of semiconductor die 102 electrically connect through contact pads 106, RDLs 122, and conductive TOVs 116.

Figure 6:
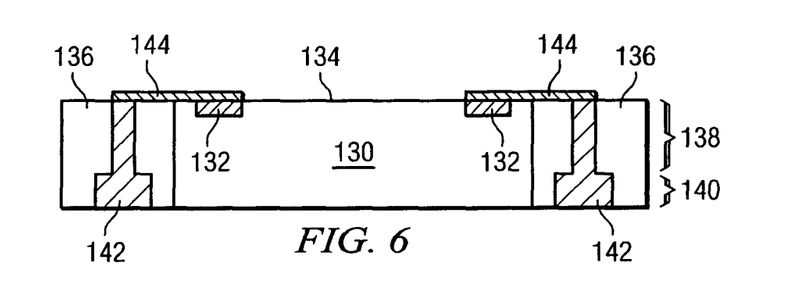
FIG. 6 illustrates another embodiment of the semiconductor die with TOVs having varying width formed in the peripheral region of the die.

An alternate embodiment of a semiconductor die with TOVs having varying width is shown in FIG. 6. In this case, the bottom-side of the TOV is larger than the topside of the TOV. After the temporary carrier is removed, as shown in FIG. 3b, semiconductor die 130 remains oriented with contact pads 132 and active surface 134 face down. A first opening or hole is formed in organic material 136 by laser drilling or DRIE to a depth of 5-500 μm. A second opening or hole is formed in organic material 136 by laser drilling or DRIE to a depth less than the depth of the first opening, e.g. less than half the depth of the first opening. The second opening is centered over the first opening to form a composite inverted T-shaped TOV. The openings can be formed with wet or dry etching using different masks. The width of the opening in vertical region 140 is greater than the width of the opening in vertical region 138. In one embodiment, the width of the opening in vertical region 140 is 5-400 μm and the width of the opening in vertical region 138 is 2.5-200 μm. The sidewalls of opening 112 and opening 114 can be vertical or tapered.

An electrically conductive material 142 is deposited into the openings to form conductive TOV using PVD, CVD, evaporation, electrolytic plating, electroless plating, screen printing, or other suitable metal deposition process. TOVs 142 have varying widths or diameters. In this case, TOV 142 has a first width in vertical region 140 of organic material 136 and a second width in vertical region 138 of organic material 136. The first width of TOV 142 in vertical region 140 is greater than the second width of the TOV in vertical region 138. The larger width of TOV 142 in region 140 provides greater alignment tolerance and simplifies interconnection when stacking semiconductor die. The smaller width of TOV 142 in region 138 requires less conductive filling, which decreases manufacturing time. TOVs 142 can have tapered sidewalls which also simplifies conductive filling.

An electrically conductive layer 144 is patterned and deposited over organic material 136 and active surface 134 of semiconductor die 130 using PVD, CVD, evaporation, electrolytic plating, electroless plating, screen printing, or other suitable metal deposition process. An optional passivation layer can be deposited over semiconductor die 130 to isolate conductive layer 144 from active surface 134. The passivation layer can be one or more layers of SiO2, Si3N4, SiON, Ta2O5, Al2O3, or other material having similar insulating and structural properties. A portion of the passivation layer is removed by an etching process to expose contact pads 132. The conductive layer 144 forms signal traces or RDL to electrically connect contact pads 132 to TOVs 142. The conductive material 142 and conductive layer 144 can be one or more layers of Al, Cu, Sn, Ni, Au, Ag, or other suitable electrically conductive material.

Semiconductor die 130 are singulated through a center portion of organic material 136 between TOVs 142. The organic material 136 is cut by a cutting tool such as a saw blade or laser. The cutting tool completely severs the peripheral region to separate the die.

Conductive TOVs 142 electrically connect through RDLs 144 to contact pads 132. Conductive TOVs 142 extend from one side of the peripheral region of semiconductor die 130 to the opposite side of the device. Conductive TOVs 142 provide electrically interconnection in the z-direction when stacking semiconductor die.

Figure 7:
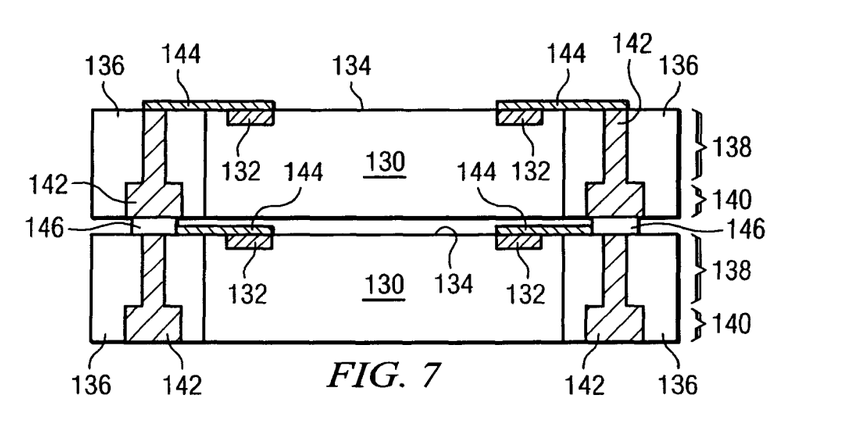
FIG. 7 illustrates two stacked semiconductor die with TOVs having varying width from FIG. 6.

FIG. 7 shows two stacked semiconductor die 130. Conductive TOVs 142 are mounted with electrically conductive bonding agent 146. The larger portion of TOV 142 in vertical region 140 increases alignment tolerance with the smaller portion of TOV 142 in vertical region 138. The electrical components within active surfaces 134 of semiconductor die 130 electrically connect through contact pads 132, RDLs 144, and conductive TOVs 142.

Figure 8:
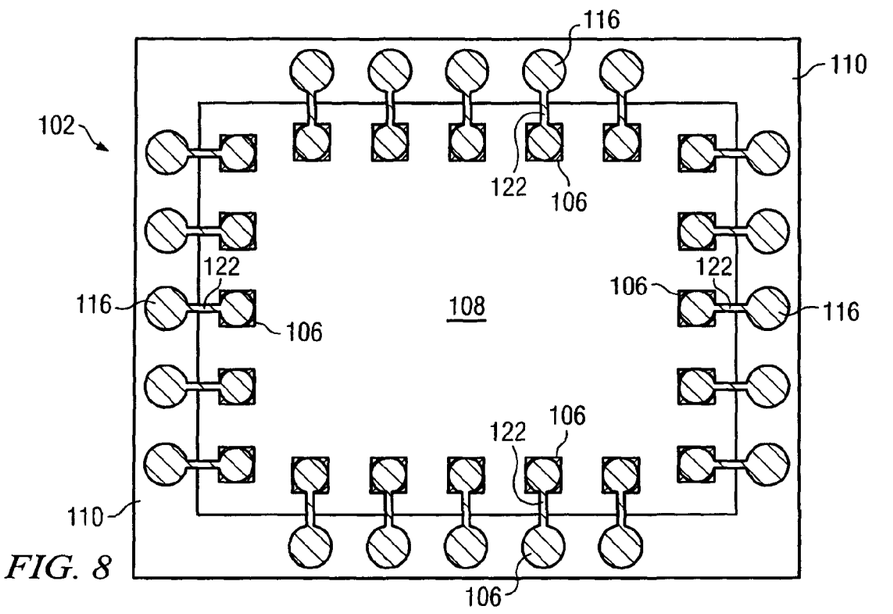
FIG. 8 is a top view of the semiconductor die with TOVs having varying width formed in the peripheral region of the die.

FIG. 8 is a top view of semiconductor die 102 with TOVs 116. Conductive TOVs 116 electrically connect through RDLs 122 to contact pads 106 and electrical components within active surface 108. Conductive TOVs 116 extend from one side of the peripheral region of semiconductor die 102 to the opposite side of the device. Conductive TOVs 116 provide electrically interconnection in the z-direction when stacking semiconductor die.

Figure 9:
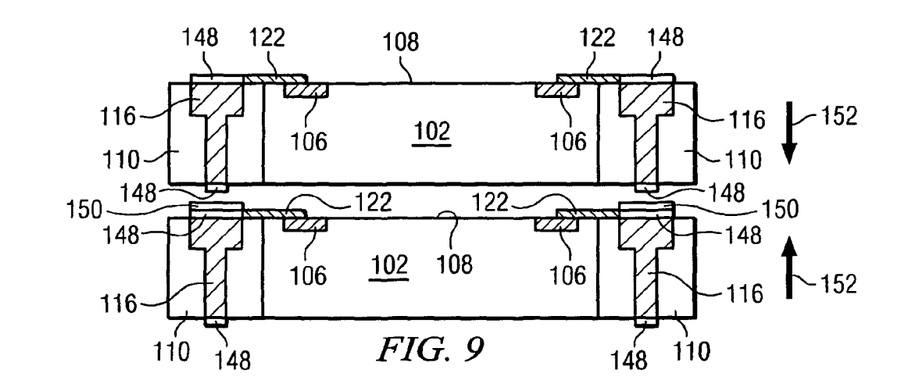
FIG. 9 illustrates two stackable semiconductor die with TOVs having varying width and an OSP coating.

In FIG. 9, two stackable semiconductor die 102 with conductive TOVs 116 are shown prior to mounting. Many metals used in conductive TOVs, such as Cu, readily oxidize. The Cu-oxide reduces adhesion strength and increases contact resistance between bonded TOVs, particularly in the presence of high temperature and high pressure during die stacking. To reduce oxidation, an organic solderability preservative (OSP) coating 148 is applied on upper and lower contact surfaces of TOVs 116. The OSP coating 148 also improves adhesion and reduces contact resistance between bonded TOVs 116.

In one embodiment, the OSP coating 148 is formed by a series of processing steps including acidic cleaning of the underlying Cu layer, water rinse, micro-etch, water rinse, acid clean, water rinse, air knife, apply OSP, air knife, low pressure water rinse, and drying to expel moisture from the OSP coating and stabilize the materials. The micro-etch can use a hydrogen-peroxide sulfuric acid. The Cu metal layer maintains a uniform and continuous OSP coating which completely fills the underlying surface. The immersion time is typically less than one minute at a temperature range of 40-45° C. The pH of the operating OSP solution should be maintained between 4.3 and 4.5.

The OSP solution may contain alkylimidazole, benzotriazole, rosin, rosin esters, or benzimidazole compounds, as described in U.S. Pat. No. 5,173,130 and incorporated herein by reference. A typical benzimidazole compound may have an alkyl group of at least three carbon atoms at the 2-position dissolved in an organic acid. When the bare copper surface is immersed in OSP solution, the benzimidazole compound in an organic acid is converted to a copper complex. The copper complex reacts with the bare copper surface and forms a layer of benzimidazole and copper complex. By incorporating copper ions in the aqueous solution of the benzimidazole and acid, the reaction rate is enhanced.

Alternatively, the OSP coating can also be made with phenylimidazole or other imidazole compounds including 2-arylimidazole as the active ingredient, as described in U.S. Pat. No. 5,560,785 and incorporated herein by reference. In any case, the OSP coating 148 is made about 0.35 µm in thickness. The OSP coating 148 selectively protects the bare copper from oxidation, which if allowed to form could interfere with the solderability of the core surfaces.

The OSP coated conductive TOVs 116 are bonded together with flux 150 to activate OSP coating 148, as shown by arrows 152, under temperature (400° C.) and pressure (4000 mbar). The electrical components within active surfaces 108 of semiconductor die 102 electrically connect through contact pads 106, RDLs 122, and conductive TOVs 116.

Figure 10:
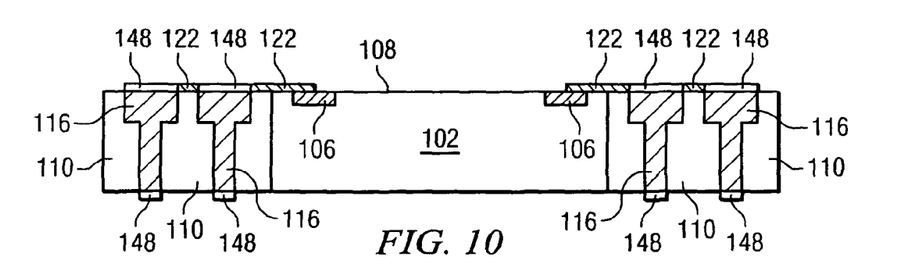
FIG. 10 illustrates the semiconductor die with multiple rows of TOVs having varying width formed in the peripheral region of the die.

FIG. 10 shows another embodiment of semiconductor die 102 with multiple rows of TOVs 116 having varying width, i.e., each with the topside of the TOV larger than the bottom-side of the TOV. The peripheral region is made sufficiently wide to accommodate the multiple rows of TOVs 116 having varying width. OSP coating 148 is applied to the upper and lower contact surfaces of conductive TOVs 116 to reduce oxidation, improve adhesion, and lower contact resistance. Conductive TOVs 116 electrically connect through RDLs 122 to contact pads 106 and electrical components within active surface 108. Conductive TOVs 116 extend from one side of the peripheral region of semiconductor die 102 to the opposite side of the device. Conductive TOVs 116 provide electrically interconnection in the z-direction when stacking semiconductor die.

Figure 11:
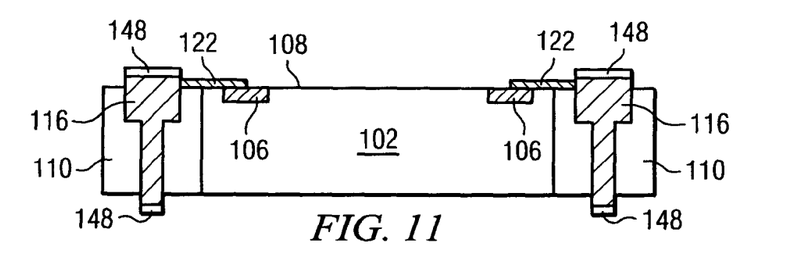
FIG. 11 illustrates the semiconductor die with TOVs having varying width extending above and below the organic material formed in the peripheral region of the die.

FIG. 11 shows another embodiment of semiconductor die 102 with TOVs 116 having varying width, i.e., each with the topside of the TOV larger than the bottom-side of the TOV. OSP coating 148 is applied to the upper and lower contact surfaces of conductive TOVs 116 to reduce oxidation, improve adhesion, and lower contact resistance. Conductive TOVs 116 electrically connect through RDLs 122 to contact pads 106 and electrical components within active surface 108. Conductive TOVs 116 extend above one surface of organic material 110 in the peripheral region of semiconductor die 102 and further extend below the opposite surface of organic material 110 in the peripheral region. The extensions of conductive TOVs 116 above and below organic material 110 provide additional vertical spacing between stacked semiconductor die. Conductive TOVs 116 provide electrically interconnection in the z-direction when stacking semiconductor die.

Figure 12:
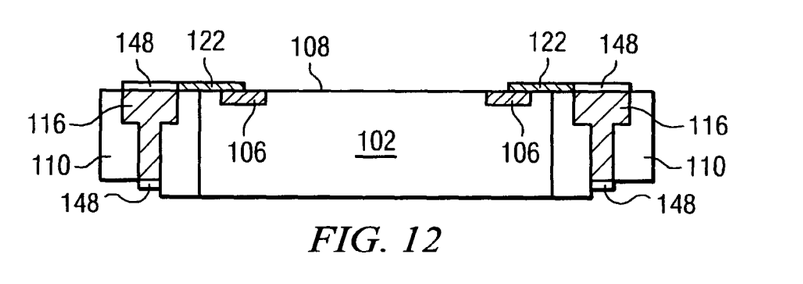
FIG. 12 illustrates the semiconductor die with TOVs having varying width recessed in the organic material.

FIG. 12 shows another embodiment of semiconductor die 102 with TOVs 116 having varying width, i.e., each with the topside of the TOV larger than the bottom-side of the TOV. OSP coating 148 is applied to the upper and lower contact surfaces of conductive TOVs 116 to reduce oxidation, improve adhesion, and lower contact resistance. Conductive TOVs 116 electrically connect through RDLs 122 to contact pads 106 and electrical components within active surface 108. The bottom-side of conductive TOVs 116 is recessed in organic material 110 with respect to a back surface of semiconductor die 102. Conductive TOVs 116 provide electrically interconnection in the z-direction when stacking semiconductor die.

Figure 13:
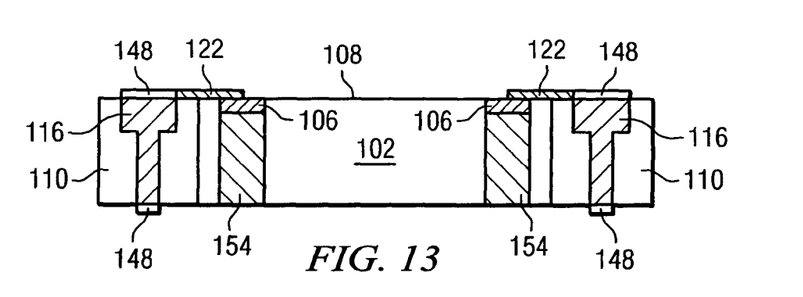
FIG. 13 illustrates the semiconductor die with TOVs having varying width and through silicon vias.

In FIG. 13, semiconductor die 102 is shown with TOVs 116 having varying width, i.e., each with the topside of the TOV larger than the bottom-side of the TOV. OSP coating 148 is applied to the upper and lower contact surfaces of conductive TOVs 116 to reduce oxidation, improve adhesion, and lower contact resistance. Conductive TOVs 116 electrically connect through RDLs 122 to contact pads 106 and electrical components within active surface 108. Conductive TOVs 116 extend from one side of the peripheral region of semiconductor die 102 to the opposite side of the device.

Semiconductor die 102 further includes through silicon vias (TSV) 154 which electrically connect to contact pads 106 and electrical components within active surface 108. TSVs 154 can be formed by etching or laser drilling vias through the silicon area of semiconductor die 102. The vias are filled with Al, Cu, Sn, Ni, Au, Ag, or other suitable electrically conductive material using evaporation, electrolytic plating, electroless plating, screen printing, PVD, or other suitable metal deposition process. Conductive TSVs 154 extend from one side of semiconductor die 102 to the opposite side of the device. Conductive TOVs 116 and TSVs 154 provide electrically interconnection in the z-direction when stacking semiconductor die.

Figure 14:
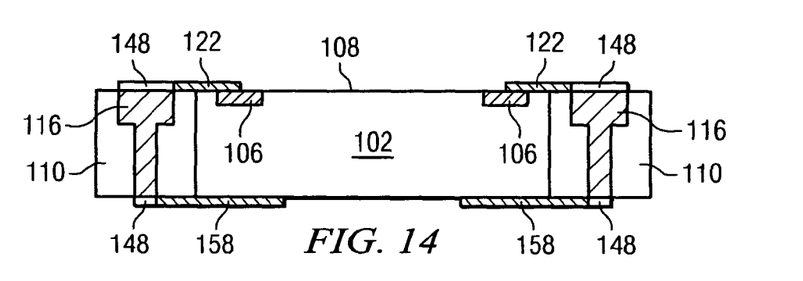
FIG. 14 illustrates the semiconductor die with TOVs having varying width and backside RDLs.

In FIG. 14, semiconductor die 102 is shown with TOVs 116 having varying width, i.e., each with the topside of the TOV larger than the bottom-side of the TOV. OSP coating 148 is applied to the upper and lower contact surfaces of conductive TOVs 116 to reduce oxidation, improve adhesion, and lower contact resistance. Semiconductor die 102 further includes backside RDL 158. RDL 158 can Al, Cu, Sn, Ni, Au, Ag, or other suitable electrically conductive material formed by evaporation, electrolytic plating, electroless plating, screen printing, PVD, or other suitable metal deposition process. Conductive TOVs 116 electrically connect through RDLs 122 and 158 to contact pads 106 and electrical components within active surface 108. Conductive TOVs 116 extend from one side of the peripheral region of semiconductor die 102 to the opposite side of the device. Conductive TOVs 116 provide electrically interconnection in the z-direction when stacking semiconductor die.

Figure 15:
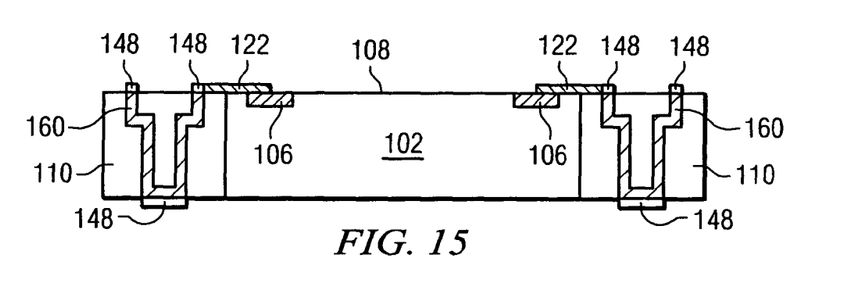
FIG. 15 illustrates the semiconductor die with conformally applied TOVs having varying width formed in the peripheral region of the die.

In FIG. 15, semiconductor die 102 is shown with TOVs having varying width, i.e., each with the topside of the TOV larger than the bottom-side of the TOV. In this case, conductive layer 160 is conformally applied to openings 112 and 114, see FIG. 3c. The remaining area of openings 112 and 114 is filled with organic material 110. OSP coating 148 is applied to the upper and lower contact surfaces of conductive TOVs 160 to reduce oxidation, improve adhesion, and lower contact resistance. Conductive TOVs 160 electrically connect through RDLs 122 to contact pads 106 and electrical components within active surface 108. Conductive TOVs 160 extend from one side of the peripheral region of semiconductor die 102 to the opposite side of the device. Conductive TOVs 160 provide electrical interconnection in the z-direction when stacking semiconductor die.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a temporary carrier;
   mounting a plurality of semiconductor die over the temporary carrier separated by a peripheral region;
   depositing an insulating material in the peripheral region;
   removing the temporary carrier;
   removing a first portion of the insulating material of the peripheral region to form a first circular hole having a first depth, the first depth less than a thickness of the insulating material;
   removing a second portion of the insulating material of the peripheral region over the first circular hole to form a second circular hole to a second depth less than the first depth, the first and second circular holes constitute a composite through organic via (TOV) having a first width in a vertical region of the first circular hole and a second width in a vertical region of the second circular hole, the second width being different from the first width;
   depositing a conductive material in the composite TOV to form a conductive TOV;
   planarizing a backside of the semiconductor die and a backside of the insulating material to remove a portion of the semiconductor die and a portion of the insulating material to expose the conductive TOV;
   forming a conductive layer between the conductive TOV and a contact pad of the semiconductor die; and
   singulating the insulating material through the peripheral region to separate the semiconductor die.

2. The method of claim 1, further including:
   stacking a plurality of semiconductor die; and
   electrically connecting the semiconductor die through the conductive TOV.

3. The method of claim 1, further including forming a plurality of rows of the conductive TOVs in the insulating material.

4. The method of claim 1, wherein the conductive TOV extends above and below the insulating material.

5. The method of claim 1, wherein the conductive TOV is recessed in the peripheral region.

6. The method of claim 1, further including forming an organic solderability preservative (OSP) coating over a contact surface of the conductive TOV.

7. The method of claim 1, wherein the conductive material is conformally applied to the composite TOV.

8. The method of claim 1, wherein the second depth is less than half the first depth.

9. The method of claim 1, wherein the first width is less than half the second width.

10. A method of making a semiconductor device, comprising:
    providing a plurality of semiconductor die separated by a peripheral region;
    depositing an insulating material in the peripheral region;
    forming a first circular opening in the insulating material of the peripheral region to a first depth;
    forming a second circular opening in the insulating material of the peripheral region over the first circular opening to a second depth less than the first depth, the first and second circular openings constitute a composite through organic via (TOV) having a first width in a vertical region of the first circular opening and a second width in a vertical region of the second circular opening, the second width being different from the first width;
    depositing a conductive material in the composite TOV to form a conductive TOV;
    planarizing and removing a portion of a backside of the semiconductor die and a backside of the insulating material to expose the conductive TOV; and
    forming a first conductive layer between the conductive TOV and a contact pad of the semiconductor die.

11. The method of claim 10, further including:
    stacking a plurality of semiconductor die; and
    electrically connecting the semiconductor die through the conductive TOV.

12. The method of claim 10, further including forming a second conductive layer over the backside of the semiconductor die opposite the contact pad, the second conductive layer being electrically connected to the conductive TOV.

13. The method of claim 10, further including forming a through silicon via in an active area of the semiconductor die, the through silicon via being electrically connected to the conductive TOV.

14. The method of claim 10, further including forming an organic solderability preservative (OSP) coating over a contact surface of the conductive TOV.

15. The method of claim 10, wherein the conductive material is conformally applied to the composite TOV.

16. The method of claim 10, wherein the second depth is less than half the first depth.

17. The method of claim 10, wherein the first width is less than half the second width.

18. A method of making a semiconductor device, comprising:
    providing a plurality of semiconductor die separated by an insulating material in a peripheral region;
    forming a first opening in the insulating material of the peripheral region to a first depth;
    forming a second opening in the insulating material of the peripheral region over the first opening to a second depth less than the first depth, the first and second openings constitute a composite through organic via (TOV) having a varying width;
    depositing a conductive material in the composite TOV to form a conductive TOV; and
    removing a portion of a backside of the semiconductor die and a portion of a backside of the insulating material to expose the conductive TOV.

19. The method of claim 18, further including forming a conductive layer between the conductive TOV and a contact pad of the semiconductor die.

20. The method of claim 18, further including forming a conductive layer over the backside of the semiconductor die opposite the contact pad, the conductive layer being electrically connected to the conductive TOV.

21. The method of claim 18, further including forming a through silicon via in an active area of the semiconductor die, the through silicon via being electrically connected to the conductive TOV.

22. The method of claim 18, further including forming an organic solderability preservative (OSP) coating over a contact surface of the conductive TOV.

23. The method of claim 18, wherein the conductive material is conformally applied to the composite TOV.

24. A method of making a semiconductor device, comprising:
    providing a semiconductor die;
    forming an insulating material in a peripheral region around the semiconductor die;
    forming an opening in the insulating material and having a first width in a first vertical region and a second width in a second vertical region, the first width greater than the second width;
    forming a conductive material within the opening; and
    reducing a thickness of the semiconductor die and a thickness of the insulating material to expose the conductive material within the opening.

25. The method of claim 24, further including forming an organic solderability preservative (OSP) coating over a contact surface of the conductive material within the opening.

26. The method of claim 24, wherein the conductive material is conformally applied within the opening.

27. The method of claim 24, further including forming a conductive layer between the conductive material within the opening and a contact pad of the semiconductor die.

28. The method of claim 24, wherein a sidewall of the opening is vertical or tapered.

29. The method of claim 24, wherein the first vertical region of the opening has a circular cross section.

* * * * *

UNITED STATES PATENT AND TRADEMARK OFFICE
CERTIFICATE OF CORRECTION

| | | |
|---|---|---|
| PATENT NO. | : 8,258,010 B2 | Page 1 of 1 |
| APPLICATION NO. | : 12/406038 | |
| DATED | : September 4, 2012 | |
| INVENTOR(S) | : Reza A. Pagaila et al. | |

It is certified that error appears in the above-identified patent and that said Letters Patent is hereby corrected as shown below:

Title Page item (54) and col. 1, line 1, in the title of the application, insert the words -- Method of -- before the words "Making a Semiconductor Device Having Conductive Through Organic Vias".

Signed and Sealed this
Sixth Day of November, 2012

David J. Kappos
*Director of the United States Patent and Trademark Office*